United States Patent [19]

Reynolds et al.

[11] 4,381,215

[45] Apr. 26, 1983

[54] METHOD OF FABRICATING A MISALIGNED, COMPOSITE ELECTRICAL CONTACT ON A SEMICONDUCTOR SUBSTRATE

[75] Inventors: Paul D. Reynolds, Cardiff; Norman W. Jones, Poway, both of Calif.

[73] Assignee: Burroughs Corporation, Detroit, Mich.

[21] Appl. No.: 153,090

[22] Filed: May 27, 1980

[51] Int. Cl.³ ................. H01L 21/283; H01L 21/308; H01L 21/316
[52] U.S. Cl. ..................................... 156/643; 29/591; 156/652; 156/656; 156/664; 156/665; 357/71; 427/82; 427/89; 427/399
[58] Field of Search ............... 156/652, 643, 656, 665, 156/664; 204/38 A, 15; 29/591; 357/71; 427/82, 89, 398

[56] References Cited

U.S. PATENT DOCUMENTS

| | | | |
|---|---|---|---|
| 3,442,701 | 5/1969 | Lepselter | 357/71 |
| 3,663,279 | 5/1972 | Lepselter | 357/71 |
| 3,806,778 | 4/1974 | Shimakura et al. | 357/71 |
| 3,864,217 | 2/1975 | Takahata et al. | 204/15 |
| 3,939,047 | 2/1976 | Tsunemitsu et al. | 357/71 |
| 4,141,022 | 2/1979 | Sigg et al. | 357/71 |
| 4,172,004 | 10/1979 | Alcorn et al. | 156/643 |
| 4,267,012 | 5/1981 | Pierce et al. | 156/643 |
| 4,289,574 | 9/1981 | Radigan et al. | 156/643 |

FOREIGN PATENT DOCUMENTS

| | | | |
|---|---|---|---|
| 2798 | 7/1979 | European Patent Off. | 156/643 |
| 54-154983 | 6/1979 | Japan | 29/571 |

OTHER PUBLICATIONS

Hitchner et al. "Chromium . . . Barrier" IBM Technical Disclosure, vol. 22, No. 10 (3/80) p. 4516.

*Primary Examiner*—Jerome W. Massie
*Attorney, Agent, or Firm*—Charles J. Fassbender; J. Ronald Richbourg; Kevin R. Peterson

[57] ABSTRACT

Disclosed is a method of fabricating an electrical contact to a region which lies at the surface of a semiconductor substrate and is doped opposite thereto. The method includes the steps of forming the combination of a silicide of a noble metal at the surface of the region, a layer of a barrier metal over the silicide, and a patterned conductor on a portion of the barrier metal layer which partly covers the region; etching partway through the portion of the barrier metal which is not covered by the patterned conductor; and thereafter oxidizing to completion, the portion of the barrier metal layer which is not covered by the patterned conductor and which remains after the etching step.

12 Claims, 7 Drawing Figures

METHOD OF FABRICATING A MISALIGNED, COMPOSITE ELECTRICAL CONTACT ON A SEMICONDUCTOR SUBSTRATE

BACKGROUND OF THE INVENTION

This invention relates to the electrical interconnection of various active devices in an integrated circuit on a semiconductor chip; and more particularly, to the formation of electrical contacts to regions at the surface of a semiconductor substrate which are doped opposite to the substrate. One such electrical contact which is widely used in the prior art is illustrated in FIGS. 1A and 1B.

In those Figures, reference numeral 10 indicates a P-type semiconductor substrate; reference numeral 11 indicates the substrate's surface; and reference numeral 12 indicates two N-type doped regions at the substrate's surface to which electrical contact is to be made. Regions 12 form the source and drain of a field-effect transistor 13.

Transistor 13 has a gate 14 which lies on an insulating layer 15. Another insulating layer 16 defines the outer perimeter of the transistor. And still another insulating layer 17 overlies the entire transistor except in those areas where electrical contact is to be made to the N-type doped regions. During fabrication, insulating layer 17 is initially formed over the entire chip; and thereafter, openings 18 are etched in it where electrical contacts are to be made.

A plurality of patterned metal conductors 19 lie on insulating layer 18 and selectively make contact to the N-type regions 12 through the openings 18. In patterning those conductors, it is highly desirable to make them as narrow as possible and to space them as close to each other as possible, in order to maximize the number of interconnections which can be made in any given area. However, a problem occurs where the conductors make contact to the N-type regions.

There, the conductors 19 must be widened from whatever minimum dimension that is possible to achieve in a given fabrication process, in order to ensure that they will completely fill the openings 18. For example, suppose that minimal dimension which can be fabricated is "L". Then, the holes 18 would be fabricated to be as small as L×L; and the conductors 19 would be enlarged to L+2ϵ around the hole. Also, any conductor which ran alongside of a hole would have to be spaced from the enlarged conductor portion by the minimal dimension L.

Actual values for L and ϵ will, of course, depend upon the particular fabrication process. But as one typical example, L and ϵ could respectively equal 2.0 um and 0.5 um. In any case, it is clear that an increased number of interconnections could be made in a given area if the extra conductor width ϵ could be eliminated from around the holes 18.

Various problems, however, exist with making the conductors 19 the same size as the hole 18. Due to misalignment tolerances, the conductors 19 could be offset from the holes 18. As a result, when the conductors 19 are patterned, a portion of the N-type regions 12 will be exposed. Consequently, the regions 12 can be contaminated with various impurities. These impurities may come, for example, from the surrounding air, or from the etchant that is used to pattern the conductors. Also, if a plasma etch is used, the surface of the N-type regions will be damaged by the impinging plasma ions.

Often, the conductors 19 are comprised of a metal having some silicon in it. The silicon is included to enhance the formation of a metal-silicon alloy at the surface of the N-type regions. When such metals are patterned however, thousands of small silicon particles are left on the surface of insulating layer 17 after the metal etch; and these must be removed with another etchant that attacks silicon. However, if portions of the N-type silicon regions 12 are exposed, those exposed portions will also be attacked by the etchant. This problem has been handled by making the N-type regions 12 very deep so that the silicon etchant will not go completely through them. But deep N-type regions are not desirable because they give rise to a large $X_j$ parameter; and thus transistors with short channel lengths cannot be fabricated.

Accordingly, a primary object of the invention is to provide an improved electrical contact to a region of a semiconductor substrate which is doped opposite to the substrate.

Another object is to provide an electrical contact through a hole in an insulating layer on a semiconductor substrate which only partially fills the hole.

Still another object is to provide a method of making an electrical contact which fulfills the above two objectives.

BRIEF SUMMARY OF THE INVENTION

These and other objects are accomplished in accordance with the invention by a method of fabricating an electrical contact to a region which lies at the surface of a semiconductor substrate and is doped opposite thereto, which includes the following steps. Initially, there is formed the combination of a silicide of a noble metal at the surface of the oppositely doped region, a layer of a barrier metal over the silicide, and a patterned conductor on a portion of the barrier metal layer which partly covers the region. Thereafter, the portion of the barrier metal layer which is not covered by the patterned conductor is etched partway through. Subsequently, the portion of the barrier metal layer which is not covered by the patterned conductor and which remains after the above etching step is oxidized to convert it to an insulator.

In performing the above combination of steps, the surface of the region which is doped opposite to the substrate is never exposed to the atmosphere after it is covered with the barrier metal layer. Consequently, no contaminants, from either the atmosphere or the etchant which is used in the above etching step, get into that region. This results in improved reliability. Also, no atoms from the patterned conductor migrate around the edge of the barrier metal layer into the oppositely doped region after the etching step. If such migration were to occur, an electrical short would form at the junction between that region and the substrate, and thus the P-N characteristics of that junction would be destroyed.

DESCRIPTION OF THE DRAWINGS

Various features and advantages of the invention will best be understood by reference to the following Detailed Description and accompanying drawings wherein.

DETAILED DESCRIPTION

Figure 1A:
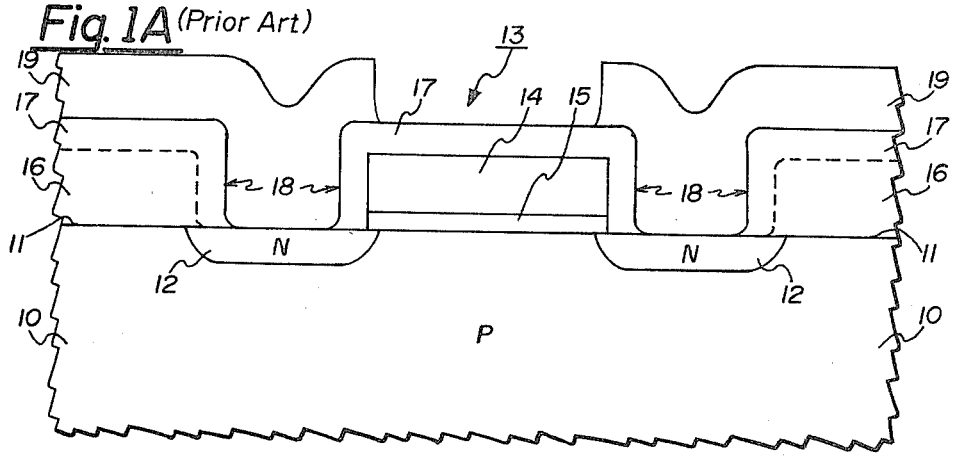
FIGS. 1A and 1B respectively are greatly enlarged cross-sectional and planar views of electrical contacts to regions that lie at the surface of a semiconductor substrate, which contacts are constructed in accordance with the prior art.
Figure 1B:
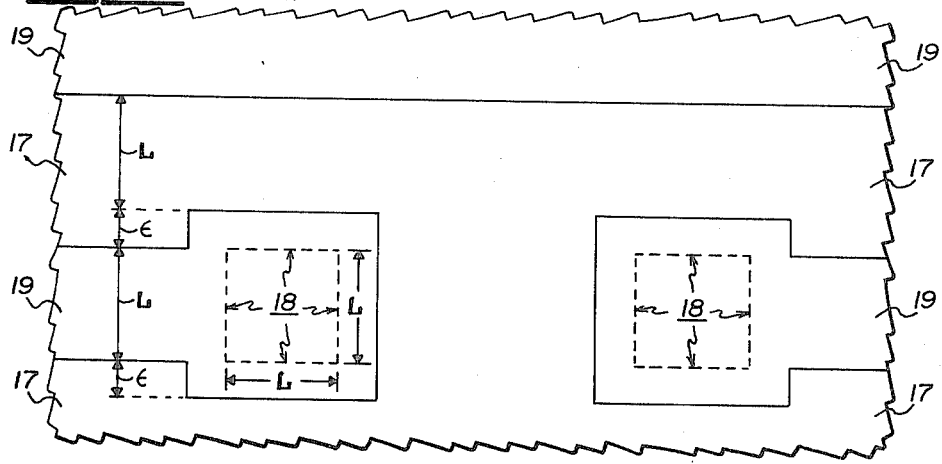
Figure 2:
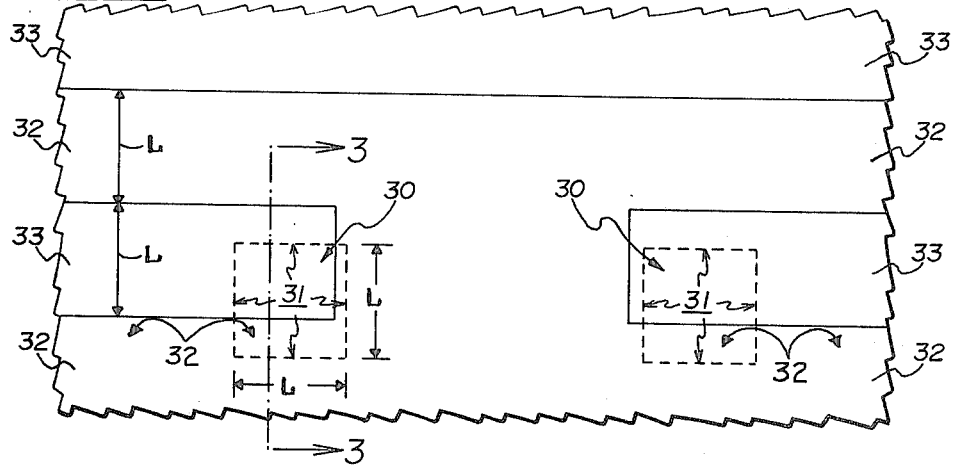
FIG. 2 is a greatly enlarged planar view of electrical contacts to regions that lie at the surface of a semiconductor substrate, which contacts are made in accordance with the invention.

Referring now to FIGS. 2 and 3A–3D, an electrical contact and method of constructing the same in accordance with the invention, will be described. Beginning with FIG. 2, there is illustrated a top view of two electrical contacts 30 which are made through holes 31 in an insulating layer 32. Patterned conductors 33 lie on layer 32 and only partially fill the holes 31. This is because they have no added width $\epsilon$ around the holes. The offset of the conductors 33 with respect to the holes may be due to mask alignment tolerances, or it may be intentionally designed in. All of the conductors 33 are patterned with a single mask; and therefore they can be spaced apart by the minimum feature dimension of L. This is in contrast to the prior art patterned conductors 19 of FIG. 1B, which were spaced by $L+\epsilon$.

FIGS. 13A–13D show a process for fabricating at the surface of a semiconductor substrate 41, which region is doped opposite to the substrate. That is, regions 40 and 41 respectively are N-type and P-type, or vice versa. Typically, region 40 will form the drain or source of a transistor, in which case the perimeter of region 40 is defined partly by a patterned thick insulating layer 42, and partly by a gate electrode (not shown). Oxide layer 42 may be 8000 Å thick $SiO_2$ for example. Region 40 can be either deep or very shallow (e.g. 2000 Å) in order to minimize the parameter $X_j$ and thus allow for the fabrication of short channel transistors.

Lying at the surface of region 40 is the silicide of noble metal 43. It is formed by covering the wafer with a layer of the noble metal, heating the wafer to form the noble metal silicide over region 40, and removing the unreacted noble metal over insulating layer 42. As a specific example, wafers can be covered with a 250 Å thick layer of Pt, heated to 450° C. for about 20 minutes, and removed from the $SiO_2$ layer 42 by 2 min strip in 85° C. aqua regia.

Figure 3A:
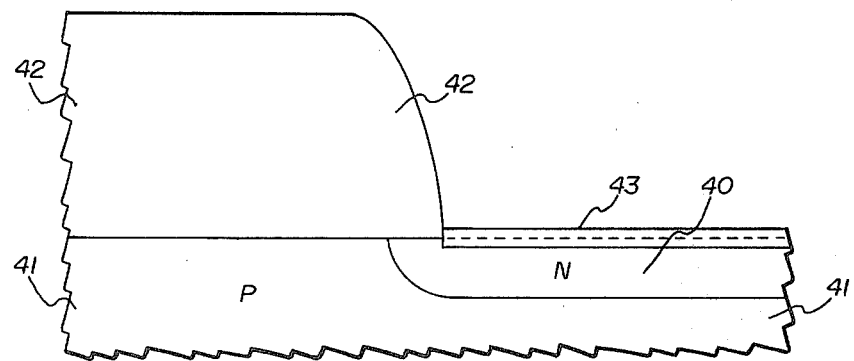
FIGS. 3A–3D are greatly enlarged cross-sectional views illustrating one electrical contact of FIG. 2 at various stages of its fabrication process.
Figure 3B:
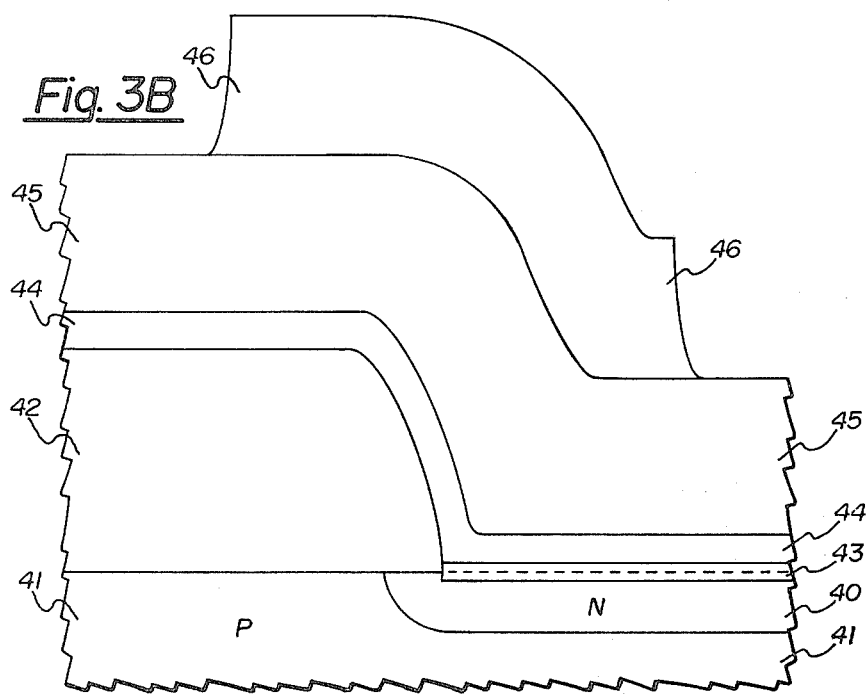

Thereafter, as illustrated in FIG. 3B, the wafer is covered with a layer of a barrier metal 44 and a layer of conductive metal 45. A barrier metal is herein defined to be one which prevents the diffusion of atoms from layer 45 through it. As one specific example, layer 44 could be 1200 Å of TiW, and layer 45 could be 6000 Å of Aluminum.

Subsequently, a patterned layer of photoresist 46 is defined on layer 45. Suitably, this resist is 5000–8000 Å thick. It is patterned to cover those portions of layers 44 and 45 which will form the previously described conductors 33 of FIG. 2.

With the patterned resist layer 46 lying in place, layer 45 is completely etched away where it is exposed. A PAWN etch (phosphoric acetic water nitric) or a $CCl_4$ plasma etch is a suitable etchant for aluminum. Those portions of layer 45 which remain are indicated by reference numeral 45a in FIGS. 3C and 3D.

Thereafter, with patterned resist layer 46 still in place, those portions of barrier metal layer 44 which are not covered by the patterned conductive layer 45a are etched partway through. This may be achieved with either a plasma etch or a wet etch. Reference numeral 44a indicates that portion of layer 44 which is thinned by this etching step, while reference numeral 44b indicates that portion of layer 44 which remains unchanged.

In performing this etch, the thickness of layer portion 44a need not be tightly controlled. It is only necessary that the layer portion 44a be thin enough to be readily oxidized and still remain a barrier to the metal of layer 45a. In the above described preferred embodiment where layer 44 was 1200 Å of TiW, the thickness of layer portion 44a can be 400 Å±200 Å. This can be obtained by using hydrogen peroxide as the etchant, and by timing the etching step. Thirty percent hydrogen peroxide 70% water etches TiW at an essentially constant rate of approximately 200 Å/min. at room temperature and pressure.

One substantial benefit of leaving layer portion 44a in place, as opposed to etching completely through it, is improved quality control—that is, improved reliability and reproducibility. For example, no contaminants will get into the PtSi layer 43 from the air, or from the etchant. Also, if a plasma etch were used to penetrate through layer 44, that plasma might damage the surface of layer 43 or surrounding boundaries. Alternatively, if a wet etch were used to penetrate through layer 44, the platinum in layer 43 would act as a catalyst for the etchant and thus the patterned conductive layer 45a would be severely undercut.

Figure 3C:
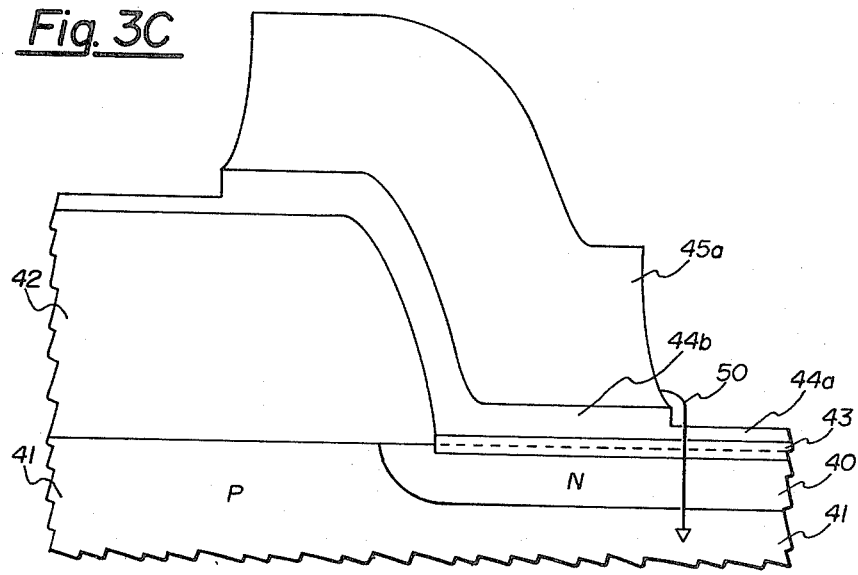
Figure 3D:
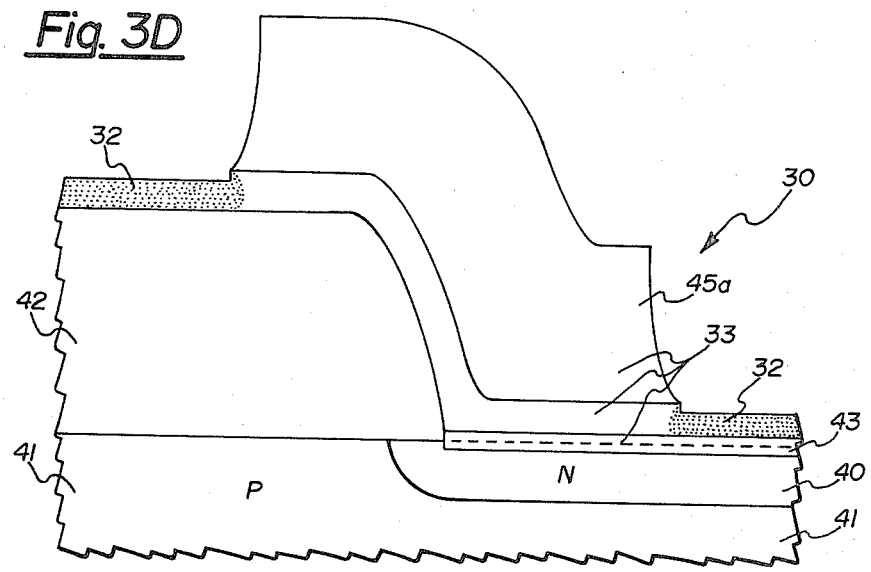

Another substantial benefit of leaving layer portion 44a in place is that no atoms from the patterned conductor 45a can migrate around the edge of layer portion 44b and into region 40. Such a migration path is indicated in FIG. 3C by reference numeral 50. If such migration were to occur, an electrical short would form all along path 50, and thus the P-N junction characteristics between region 40 and substrate 41 would be destroyed. This would be a catastrophic failure.

Following the above etching steps, layer portion 44a is completely oxidized. This oxidized layer portion is indicated by reference numeral 32 in FIG. 3D. For TiW, the oxidation can occur in an atmosphere of wet $O_2$ at a temperature of 450° C. This temperature is sufficiently below the melting point of Al (which is 577° C.) so as to allow the patterned conductive layer 45a to be made of that material.

Various experiments have been run by the applicants to test this oxidation step. For TiW, the oxidation rate under the above conditions is as follows: 250 Å after about ¼ hour, 400 Å after about ½ hour, 525 Å after about ¾ hour, and 600 Å after about 1 hour. This oxidation step produces $TiO_2$, $WO_3$, and $W_2O_5$ in layer 32. The electrical insulation provided by 600 Å of oxidized TiW was measured to be over 200 volts.

One preferred embodiment of the invention has now been described in detail. In addition, however, various changes and modifications can be made to these details without departing from the nature and spirit of the invention. Thus, it is to be understood that the invention is not limited to said details but is defined by the appended claims.

What is claimed is:

1. A method of fabricating an electrical contact to a region which lies at the surface of a semiconductor substrate and is exposed through an opening in an insulating layer that overlies said surface; said method including the steps of:

forming the combination of a silicide of a noble metal throughout the exposed surface of said region, a layer of a barrier metal over said silicide and said insulating layer, and a patterned conductor on a portion of said barrier metal layer; said patterned conductor being in misalignment with said opening such that it covers only part of said silicide and an adjacent portion of said insulating layer;

etching partway through the portion of said barrier metal layer which is not covered by said patterned conductor; and thereafter oxidizing the portion of said barrier metal layer which is not covered by said patterned conductor and which remains after said etching step.

2. A method according to claim 1 wherein said region is doped N-type and said substrate is P-type.

3. A method according to claim 1 wherein said region is doped P-type and said substrate is N-type.

4. A method according to claim 1 wherein said barrier metal layer as formed is at least 1000 Å thick, and is reduced to less than 600 Å by said etching step.

5. A method according to claim 1 wherein said etching step is performed by a wet chemical etch.

6. A method according to claim 1 wherein said etching step is performed by a plasma etch.

7. A method according to claim 1 wherein said noble metal is platinum.

8. A method according to claim 1 wherein said barrier metal is titanium-tungsten.

9. A method according to claim 1 wherein said conductor is aluminum.

10. In a method of fabricating an electrical contact to a region which lies at the surface of a semiconductor substrate and is exposed through a rectangular opening in an insulating layer that overlies said surface; the improvement comprising the steps of forming a silicide of a noble metal throughout the exposed surface of said region; thereafter forming a layer of a barrier metal over said silicide and said insulating layer; thereafter forming a patterned conductor on a portion of said barrier metal layer, said patterned conductor being of substantially the same width as said opening and in misalignment with it as to cover only part of said exposed region and an adjacent portion of said insulating layer; and thereafter oxidizing at least a portion of said barrier metal layer which is not covered by said patterned conductor.

11. The invention of claim 10, and further including the steps of etching partway through the portion of said barrier metal layer which is not covered by said patterned conductor prior to said oxidizing step.

12. The invention according to claim 10 wherein said width of said opening and said patterned conductor equals the minimal dimension that can be made by method of fabricating.

* * * * *